United States Patent
Lai et al.

(10) Patent No.: US 9,741,896 B2
(45) Date of Patent: Aug. 22, 2017

(54) SEMICONDUCTOR LIGHT-EMITTING DEVICE

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/174,855

(22) Filed: Jun. 6, 2016

(65) Prior Publication Data
US 2017/0133552 A1    May 11, 2017

(30) Foreign Application Priority Data
Nov. 10, 2015    (TW) .............................. 104136951 A

(51) Int. Cl.
| | |
|---|---|
| H01L 33/06 | (2010.01) |
| H01L 33/02 | (2010.01) |
| H01L 33/32 | (2010.01) |
| H01L 33/58 | (2010.01) |
| H01L 33/14 | (2010.01) |
| H01S 5/343 | (2006.01) |
| H01S 5/30 | (2006.01) |
| H01S 5/34 | (2006.01) |
| H01S 5/20 | (2006.01) |

(52) U.S. Cl.
CPC ............ *H01L 33/06* (2013.01); *H01L 33/025* (2013.01); *H01L 33/145* (2013.01); *H01L 33/32* (2013.01); *H01L 33/58* (2013.01); *H01S 5/2009* (2013.01); *H01S 5/3063* (2013.01); *H01S 5/3086* (2013.01); *H01S 5/3425* (2013.01); *H01S 5/34333* (2013.01)

(58) Field of Classification Search
CPC ..... H01L 33/06; H01L 33/025; H01L 33/145; H01L 33/32; H01L 33/58; H01S 5/2009; H01S 5/3063; H01S 5/3086; H01S 5/3425; H01S 5/34333
See application file for complete search history.

(56) References Cited

U.S. PATENT DOCUMENTS

| | | | |
|---|---|---|---|
| 2007/0080352 A1* | 4/2007 | Wu ..................... | H01L 21/0237 257/79 |
| 2011/0188528 A1* | 8/2011 | Kisin ................... | B82Y 20/00 372/44.011 |

FOREIGN PATENT DOCUMENTS

| | | |
|---|---|---|
| TW | 200715601 | 4/2007 |
| TW | 201133925 | 10/2011 |

OTHER PUBLICATIONS

"Office Action of Taiwan Counterpart Application", issued on Jul. 19, 2016, p. 1-p. 5.

* cited by examiner

*Primary Examiner* — Armando Rodriguez
(74) *Attorney, Agent, or Firm* — J.C. Patents

(57) ABSTRACT

A semiconductor light-emitting device including a P-type semiconductor cladding layer, an N-type semiconductor layer, a light-emitting layer, and a hole injection layer is provided. The P-type semiconductor cladding layer is doped with magnesium. The light-emitting layer is disposed between the P-type semiconductor cladding layer and the N-type semiconductor layer. The hole injection layer is disposed between the P-type semiconductor cladding layer and the light-emitting layer. The hole injection layer includes a first super lattice structure formed by alternately stacking a plurality of magnesium nitride layers and a plurality of semiconductor material layers. The chemical formula of each of the semiconductor material layers is $Al_xIn_yGa_{1-x-y}N$, and $0 \le x \le 1$, $0 \le y \le 1$, and $0 \le x+y \le 1$.

14 Claims, 6 Drawing Sheets

SEMICONDUCTOR LIGHT-EMITTING DEVICE

CROSS-REFERENCE TO RELATED APPLICATION

This application claims the priority benefit of Taiwan application serial no. 104136951, filed on Nov. 10, 2015. The entirety of the above-mentioned patent application is hereby incorporated by reference herein and made a part of this specification.

BACKGROUND OF THE INVENTION

Field of the Invention

The invention relates to a light-emitting device, and more particularly, to a semiconductor light-emitting device.

Description of Related Art

With the rapid development of semiconductor technology, the introduction of semiconductor devices such as light-emitting diodes (LEDs) and laser diodes (LDs) has significantly changed the way we live. LEDs have advantages such as power-saving, small size, short reaction time, and long life, and are currently widely applied in areas of display and illumination. Moreover, LDs have advantages such as high energy efficiency, small size, lightweight, and low price, and are also widely applied in many areas such as optical fiber communication, optical discs, laser printers, laser scanners, and laser pointers.

In general, in the semiconductor device manufacture process, dopants used as donors and acceptors are added in suitable amounts in a semiconductor material via a doping method, so as to adjust the type and the concentration of the conductive carrier of the semiconductor material, such that the doped semiconductor material forms an N-type semiconductor and a P-type semiconductor having different electrical properties. In a semiconductor device, the interface between the N-type semiconductor and the P-type semiconductor forms diode characteristics. For instance, the light-emitting method of both the LED and the semiconductor laser includes applying current to a compound semiconductor. Electrons and holes to which current is applied respectively pass through the N-type semiconductor and the P-type semiconductor, and electron-hole combining is formed on the interface having diode characteristics between the N-type semiconductor and the P-type semiconductor. The LED or the semiconductor laser converts electron-hole combining into a form of light to be released according to the individual characteristics of the semiconductor material. In other words, in the electroluminescent process, doping of the semiconductor material plays an important role in the efficacy of the device.

In general, the method of doping the same layer of the semiconductor includes growing a doped semiconductor material layer via metal-organic chemical vapor deposition (MOCVD) or implanting a doping element in an undoped semiconductor material via ion implantation. However, these doping methods readily cause defect or dislocation to the semiconductor material lattice, such that the efficacy of the semiconductor device cannot be readily increased. At the same time, this issue is also one of the current bottlenecks of increasing the photoelectric conversion efficiency of LEDs and laser diodes.

SUMMARY OF THE INVENTION

The invention provides a semiconductor light-emitting device having less lattice defects.

An embodiment of the invention provides a semiconductor light-emitting device including a P-type semiconductor cladding layer, an N-type semiconductor layer, a light-emitting layer, and a hole injection layer. The P-type semiconductor cladding layer is doped with magnesium. The light-emitting layer is disposed between the P-type semiconductor cladding layer and the N-type semiconductor layer. The hole injection layer is disposed between the P-type semiconductor cladding layer and the light-emitting layer. The hole injection layer includes a first super lattice (SL) structure formed by alternately stacking a plurality of magnesium nitride layers and a plurality of semiconductor material layers. The chemical formula of each of the semiconductor material layers is $Al_xIn_yGa_{1-x-y}N$, and $0 \leq x \leq 1$, $0 \leq y \leq 1$, and $0 \leq x+y \leq 1$.

In an embodiment of the invention, the thickness ratio of the magnesium nitride layer and the semiconductor material layer is within the range of 0.1 to 1.5.

In an embodiment of the invention, each of the semiconductor material layers is doped with a Group IV element having a concentration within the range of $10^{16}$ cm$^{-3}$ to $10^{20}$ cm$^{-3}$.

In an embodiment of the invention, the group IV element is carbon.

In an embodiment of the invention, the magnesium concentration of the magnesium nitride layers is greater than the magnesium concentration of the P-type semiconductor cladding layer.

In an embodiment of the invention, the semiconductor light-emitting device further includes a P-type waveguide layer, an N-type waveguide layer, and an N-type semiconductor cladding layer. The P-type waveguide layer is disposed between the P-type semiconductor cladding layer and the light-emitting layer. The N-type waveguide layer is disposed between the N-type semiconductor layer and the light-emitting layer. The N-type semiconductor cladding layer is disposed between the N-type semiconductor layer and the N-type waveguide layer. The hole injection layer is disposed between the P-type waveguide layer and the light-emitting layer, or disposed between the P-type waveguide layer and the P-type semiconductor cladding layer.

In an embodiment of the invention, the semiconductor light-emitting device further includes an electron-blocking layer (EBL) disposed between the P-type semiconductor cladding layer and the P-type waveguide layer. The bandgap of the EBL is greater than the bandgap of the light-emitting layer.

In an embodiment of the invention, the hole injection layer is disposed between the EBL and the P-type waveguide layer.

In an embodiment of the invention, the hole injection layer is disposed between the P-type waveguide layer and the light-emitting layer.

In an embodiment of the invention, the material of the EBL includes aluminum gallium indium nitride (AlGaInN).

In an embodiment of the invention, the semiconductor light-emitting device further includes an EBL disposed between the P-type waveguide layer and the light-emitting layer. The hole injection layer is disposed between the P-type waveguide layer and the EBL. The bandgap of the EBL is greater than the bandgap of the light-emitting layer.

In an embodiment of the invention, the material of the P-type waveguide layer and the material of the N-type waveguide layer include indium gallium nitride (InGaN).

In an embodiment of the invention, the P-type semiconductor cladding layer or the N-type semiconductor cladding layer includes a second SL structure formed by alternately stacking a plurality of AlGaInN layers and a plurality of gallium nitride (GaN) layers.

In an embodiment of the invention, the semiconductor light-emitting device further includes an EBL disposed between the P-type semiconductor cladding layer and the light-emitting layer. The hole injection layer is disposed between the EBL and the light-emitting layer. The bandgap of the EBL is greater than the bandgap of the light-emitting layer.

Based on the above, the hole injection layer of the semiconductor light-emitting device of an embodiment of the invention is disposed between the P-type semiconductor cladding layer and the light-emitting layer. The hole injection layer includes a first SL structure formed by alternately stacking a plurality of magnesium nitride layers and a plurality of semiconductor material layers. The chemical formula of each of the semiconductor material layers is $Al_xIn_yGa_{1-x-y}N$, and $0 \leq x \leq 1$, $0 \leq y \leq 1$, and $0 \leq x+y \leq 1$. Since the semiconductor material layers achieve P-type doping via the diffusion of magnesium element of the magnesium nitride layer, the lattice defects of the semiconductor light-emitting device are less.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
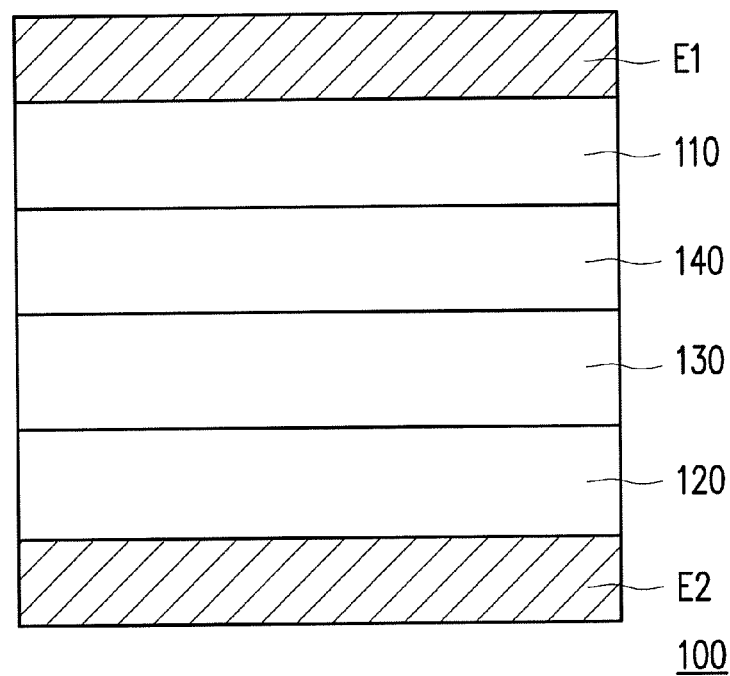
FIG. 1A is a schematic of a semiconductor light-emitting device of an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
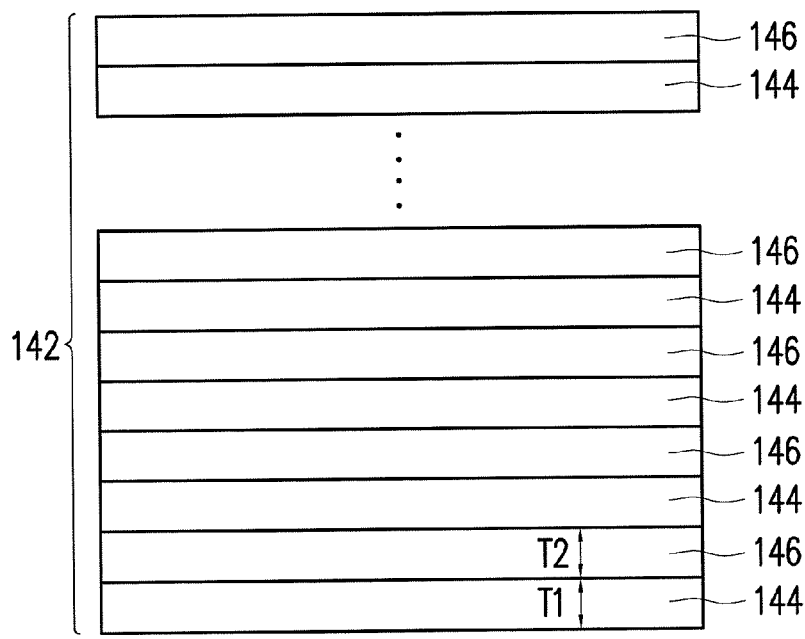
FIG. 1B is a schematic of a hole injection layer of the embodiment of FIG. 1A.

FIG. 1A is a schematic of a semiconductor light-emitting device of an embodiment of the invention, and FIG. 1B is a schematic of a hole injection layer of the embodiment of FIG. 1A. Please refer to both FIGS. 1A and 1B. It should be mentioned that, to clearly describe each layered structure of the semiconductor light-emitting device, each layered structure of FIG. 1A and FIG. 1B is drawn to proper size and thickness. The invention is not limited to the relationship between the size and the thickness of each layered structure of the semiconductor light-emitting device illustrated in FIG. 1A and FIG. 1B. In the present embodiment, a semiconductor light-emitting device 100 includes a P-type semiconductor cladding layer 110, an N-type semiconductor layer 120, and a light-emitting layer 130. The light-emitting layer 130 is disposed between the P-type semiconductor cladding layer 110 and the N-type semiconductor layer 120. Specifically, the material of the P-type semiconductor cladding layer 110 includes P-type gallium nitride (GaN), and the material of the N-type semiconductor layer 120 includes N-type GaN.

In some embodiments, the material of the P-type semiconductor cladding layer 110 can also be other P-type doped Group III-V semiconductor compounds, and the N-type semiconductor layer 120 can also be other N-type doped Group III-V semiconductor compounds. Specifically, the P-type doped Group III-V semiconductor compound includes a Group II element, such as magnesium (Mg), doped Group III-V semiconductor compound. The N-type doped Group III-V semiconductor compound includes a Group IV element, such as silicon (Si), doped Group III-V semiconductor compound, but the invention is not limited thereto. Moreover, the P-type semiconductor cladding layer 110 and the N-type semiconductor layer 120 can be single-layer structures, multi-layered structures, super lattice (SL) structures, or other types of structures. Moreover, in the present embodiment, the light-emitting layer 130 includes a multiple quantum well (MQW) structure, such as an MQW structure formed by alternately stacking a plurality of GaN layers and a plurality of indium gallium nitride (InGaN) layers, but the invention is not limited thereto. However, in some embodiments, the light-emitting layer 130 can also include a quantum well (QW) structure or other structures, and the invention is not limited thereto.

In the present embodiment, the semiconductor light-emitting device 100 further includes a hole injection layer 140. The hole injection layer 140 is disposed between the P-type semiconductor cladding layer 110 and the light-emitting layer 130. In the present embodiment, the hole injection layer 140 includes a first SL structure 142 formed by alternately stacking a plurality of magnesium nitride layers 144 and a plurality of semiconductor material layers 146, as shown in FIG. 1B. In the first SL structure 142, the chemical formula of each of the semiconductor material layers 146 is $Al_xIn_yGa_{1-x-y}N$, and $0 \leq x \leq 1$, $0 \leq y \leq 1$, and $0 \leq x+y \leq 1$. In the present embodiment, the material of the magnesium nitride layers 144 includes magnesium nitride ($Mg_3N_2$), and the material of the semiconductor material layers 146 can be, for instance, $In_yGa_{1-y}N$, $0 \leq y \leq 1$, or, for instance, $Al_xGa_{1-x}N$, $0 \leq x \leq 1$, or, for instance, GaN. In some embodiments, the material of the magnesium nitride layers 144 can also include other compound-form Group II elements, or other compounds suitable for P-type doping. In the present embodiment, the P-type semiconductor cladding layer 110 is doped with magnesium, and the magnesium concentration of the magnesium nitride layers 144 is greater than the magnesium concentration of the P-type semiconductor cladding layer 110. That is, the magnesium nitride layers 144 adjacent to the light-emitting layer 130 have a high concentration of a P-type magnesium dopant, and can have a high hole concentration, such that more holes are provided to enter the light-emitting layer 130 as a result. Preferably, the magnesium concentration of the magnesium nitride layers 144 is 1.2 to 3 times the magnesium concentration of the P-type semiconductor cladding layer 110, and the invention is not limited thereto.

In the present embodiment, each of the semiconductor material layers 146 is doped with a Group IV element having a concentration within the range of $10^{16}$ cm$^{-3}$ to $10^{20}$ cm$^{-3}$. Specifically, the Group IV element doped in the semiconductor material layers 146 replaces a portion of the pentavalent nitrogen atoms in the semiconductor material layers 146. Therefore, the semiconductor material layers 146 can increase the number of holes carrying positive charge, such that the hole injection layer 140 can have a high hole concentration. If the doping concentration of the Group IV element in the semiconductor material layers 146 is less than $10^{16}$ cm$^{-3}$, then the hole injection layer 140 cannot have the effect of providing holes. Moreover, if the doping concentration of the Group IV element in the semiconductor material layers 146 is greater than $10^{20}$ cm$^{-3}$, then the resistance of the hole injection layer 140 is too high. Preferably, the doping concentration of the Group IV element in the semiconductor material layers 146 is within the range of $5\times10^{16}$ cm$^{-3}$ to $10^{19}$ cm$^{-3}$.

In the present embodiment, the Group IV element of the semiconductor material layers 146 is carbon. Specifically, in the epitaxial process of the semiconductor material layers 146, carbon reacts with hydrogen decomposed from ammonia gas to form a stable compound methane and leave the hole injection layer 140. Therefore, the hydrogen content of the semiconductor material layers 146 is reduced, such that bonding of magnesium and hydrogen is reduced, and magnesium can effectively be in an ionic state as a result. In other words, the hole injection layer 140 can overall have a high hole concentration to provide more holes to enter the light-emitting layer 130, such that electron-hole combining is more frequent. In some embodiments, the Group IV element of the semiconductor material layers 146 can also be, for instance, silicon (Si), germanium (Ge), tin (Sn), or lead (Pb), and the invention is not limited thereto.

In the present embodiment, the magnesium nitride layer 144 has a thickness T1, and the semiconductor material layer 146 has a thickness T2. Specifically, the ratio of the thickness T1 and the thickness T2 is within the range of 0.1 to 1.5. In some embodiments, the thickness T1 of the magnesium nitride layers 144 and the thickness T2 of the semiconductor material layers 146 can also be adjusted according to different semiconductor device performance requirements and related process specifications. Moreover, in other embodiments, the hole injection layer 140 can also include other material layers or other types of SL structures, and the invention is not limited thereto.

In the present embodiment, the semiconductor light-emitting device 100 further includes a first electrode E1 and a second electrode E2. The first electrode E1 is disposed at another side of the P-type semiconductor cladding layer 110 opposite to the light-emitting layer 130, and the second electrode E2 is disposed at another side of the N-type semiconductor layer 120 opposite to the light-emitting layer 130. Specifically, the semiconductor light-emitting device 100 is electrically connected to a corresponding external electrode via the first electrode E1 and the second electrode E2. The light-emitting layer 130 emits light via the current conducted by the corresponding external electrode.

Specifically, the semiconductor material layers 146 of the hole injection layer 140 can diffuse the magnesium element of the magnesium nitride layers 144 from the interface of the semiconductor material layers 146 and the magnesium nitride layers 144 to the inside of the semiconductor material layers 146 via, for instance, a diffusion method. As a result, magnesium element enters the lattice of the semiconductor material layers 146 to achieve the effect of P-type doping. In the present embodiment, since P-type doping is achieved for a plurality of semiconductor material layers 146 of the first SL structure 142 via magnesium element doping of the magnesium nitride layers 144, the hole content of the semiconductor material layers 146 inside the first SL structure 142 is increased. Specifically, when current is applied such that the semiconductor light-emitting device 100 emits light, the hole injection layer 140 can provide more hole injection such that the light-emitting layer 130 achieves more electron-hole combining, and therefore the electroluminescent efficacy of the semiconductor light-emitting device 100 is increased. In the present embodiment, these P-type doped semiconductor material layers 146 are not manufactured by a method of doping a P-type dopant at the same time that growth occurs via metal-organic chemical vapor deposition (MOCVD), and are also not manufactured by a method of implanting a doping element in an undoped semiconductor material via ion implantation. Therefore, the material lattice defects or dislocations of these P-type doped semiconductor material layers 146 are less, such that the lattice defects of the semiconductor light-emitting device 100 are less overall. Since the lattice defects of the semiconductor light-emitting device 100 are less, the efficacy of the semiconductor light-emitting device 100 can be increased.

Figure 2:
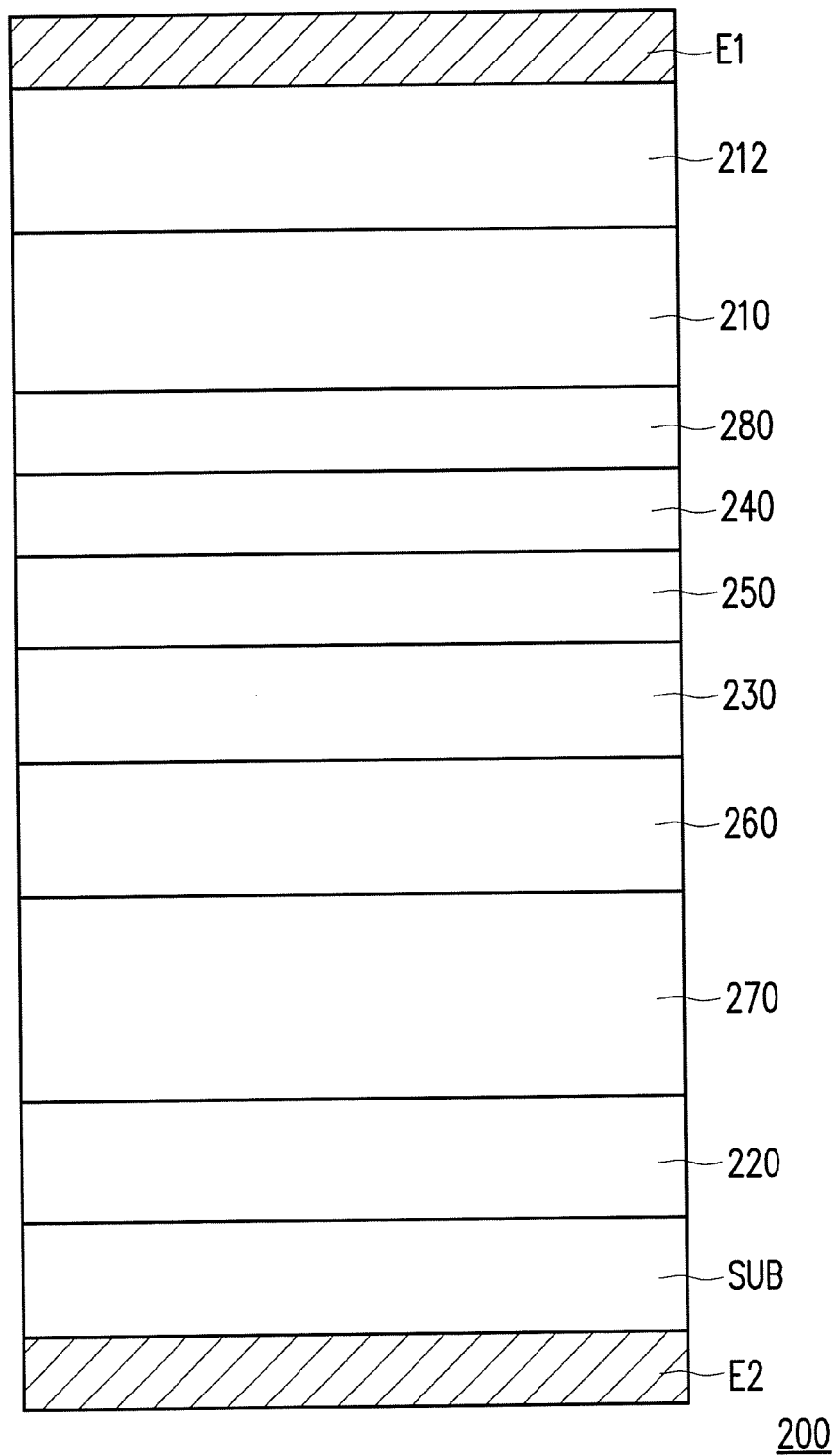
FIG. 2 is a schematic of a semiconductor light-emitting device of another embodiment of the invention.

FIG. 2 is a schematic of a semiconductor light-emitting device of another embodiment of the invention. Please refer to FIG. 2. It should be mentioned that, the invention is not limited to the relationship between the size and the thickness of each layered structure of the semiconductor light-emitting device illustrated in FIG. 2. In the present embodiment, a semiconductor light-emitting device 200 is similar to the semiconductor light-emitting device 100 of FIG. 1A. Relevant components and functions of the semiconductor light-emitting device 200 are as described for the semiconductor light-emitting device 100 and are not repeated herein. The difference between the semiconductor light-emitting device 200 and the semiconductor light-emitting device 100 is that the semiconductor light-emitting device 200 further includes a P-type waveguide layer 250, an N-type waveguide layer 260, and an N-type semiconductor cladding layer 270. The P-type waveguide layer 250 is disposed between a P-type semiconductor cladding layer 210 and a light-emitting layer 230, and the N-type waveguide layer 260 is disposed between an N-type semiconductor layer 220 and the light-emitting layer 230. Moreover, the N-type semiconductor cladding layer 270 is disposed between the N-type semiconductor layer 220 and the N-type waveguide layer 260.

In the present embodiment, the material of the P-type waveguide layer 250 and the material of the N-type waveguide layer 260 include, for instance, InGaN or other semiconductor materials. Moreover, the P-type semiconductor cladding layer 210 or the N-type semiconductor cladding layer 270 includes, for instance, a second SL structure formed by alternately stacking a plurality of aluminum gallium indium nitride (AlGaInN) layers and a plurality of GaN layers. However, in some embodiments, the P-type semiconductor cladding layer 210 or the N-type semiconductor cladding layer 270 can also be an SL structure formed by stacking other different semiconductor materials. Moreover, the P-type semiconductor cladding layer 210 and the N-type semiconductor cladding layer 270 can also respectively be other P-type doped semiconductor compounds and N-type doped semiconductor compounds. The structure of the P-type semiconductor cladding layer 210 and the structure of the N-type semiconductor cladding layer 270 can be, for instance, single-layer structures, multi-layered structures, or other types of structures, and the invention is not limited thereto.

In the present embodiment, the semiconductor light-emitting device 200 further includes an electron-blocking layer (EBL) 280 disposed between the P-type semiconductor cladding layer 210 and the P-type waveguide layer 250. Specifically, the bandgap of the EBL 280 is greater than the bandgap of the light-emitting layer 230. Therefore, the EBL 280 can block electrons passing through the light-emitting layer 230. Since electrons blocked by the EBL 280 are confined to the inside the light-emitting layer 230 or around the light-emitting layer 230, the opportunity of electron-hole combining inside the light-emitting layer 230 is increased, such that the light-emitting efficacy of the semiconductor light-emitting device 200 is increased. In the present embodiment, the material of the EBL 280 includes, for instance, aluminum gallium nitride (AlGaN), AlGaInN, or other semiconductor materials, and preferably includes AlGaInN. Moreover, in the present embodiment, a hole injection layer 240 is disposed between the EBL 280 and the P-type waveguide layer 250. The hole injection layer 240 is similar to the hole injection layer 140 of the embodiment of FIG. 1A, and the material and the structure of the hole injection layer 240 are as described for the hole injection layer 140, and are therefore not repeated herein.

Please refer further to FIG. 2. In the present embodiment, the semiconductor light-emitting device 200 further includes a P-type semiconductor layer 212, a substrate SUB, a first electrode E1, and a second electrode E2. Specifically, the P-type semiconductor cladding layer 210 is disposed between the P-type semiconductor layer 212 and the EBL 280. The N-type semiconductor layer 220 is disposed between the light-emitting layer 230 and the substrate SUB. The P-type semiconductor layer 212 is disposed between the first electrode E1 and the P-type semiconductor cladding layer 210, and the substrate SUB is disposed between the N-type semiconductor layer 220 and the second electrode E2.

In the present embodiment, the P-type semiconductor layer 212 includes, for instance, P-type GaN or other semiconductor compounds. The material and the structure of the P-type semiconductor layer 212 can be the same as or different from those of the P-type semiconductor cladding layer. Specifically, the material of the substrate SUB is, for instance, GaN or other electrically conductive materials. In some embodiments, the material of the substrate SUB adopts a single-crystal compound for which the lattice constant is close to that of the N-type semiconductor layer 220.

In the present embodiment, the first electrode E1 is disposed at another side of the P-type semiconductor layer 212 opposite to the light-emitting layer 230, and the second electrode E2 is disposed at another side of the substrate SUB opposite to the light-emitting layer 230. The semiconductor light-emitting device 200 is electrically connected to a corresponding external electrode via the first electrode E1 and the second electrode E2. The light-emitting layer 230 emits light via the current conducted by the corresponding external electrode. Specifically, the semiconductor light-emitting device 200 is, for instance, a laser diode (LD).

Specifically, since the semiconductor light-emitting device 200 includes the hole injection layer 240, and the hole injection layer 240 is disposed between the P-type semiconductor cladding layer 210 and the light-emitting layer 230, the hole injection layer 240 can provide more holes such that the light-emitting layer 230 achieves more electron-hole combining. At the same time, at least the material lattice defects or dislocations of the P-type-doped semiconductor material layers (not shown) of the hole injection layer 240 are less, such that the lattice defects of the semiconductor light-emitting device 200 overall are less. Therefore, the electroluminescent efficacy of the semiconductor light-emitting device 200 can be increased.

Figure 3:
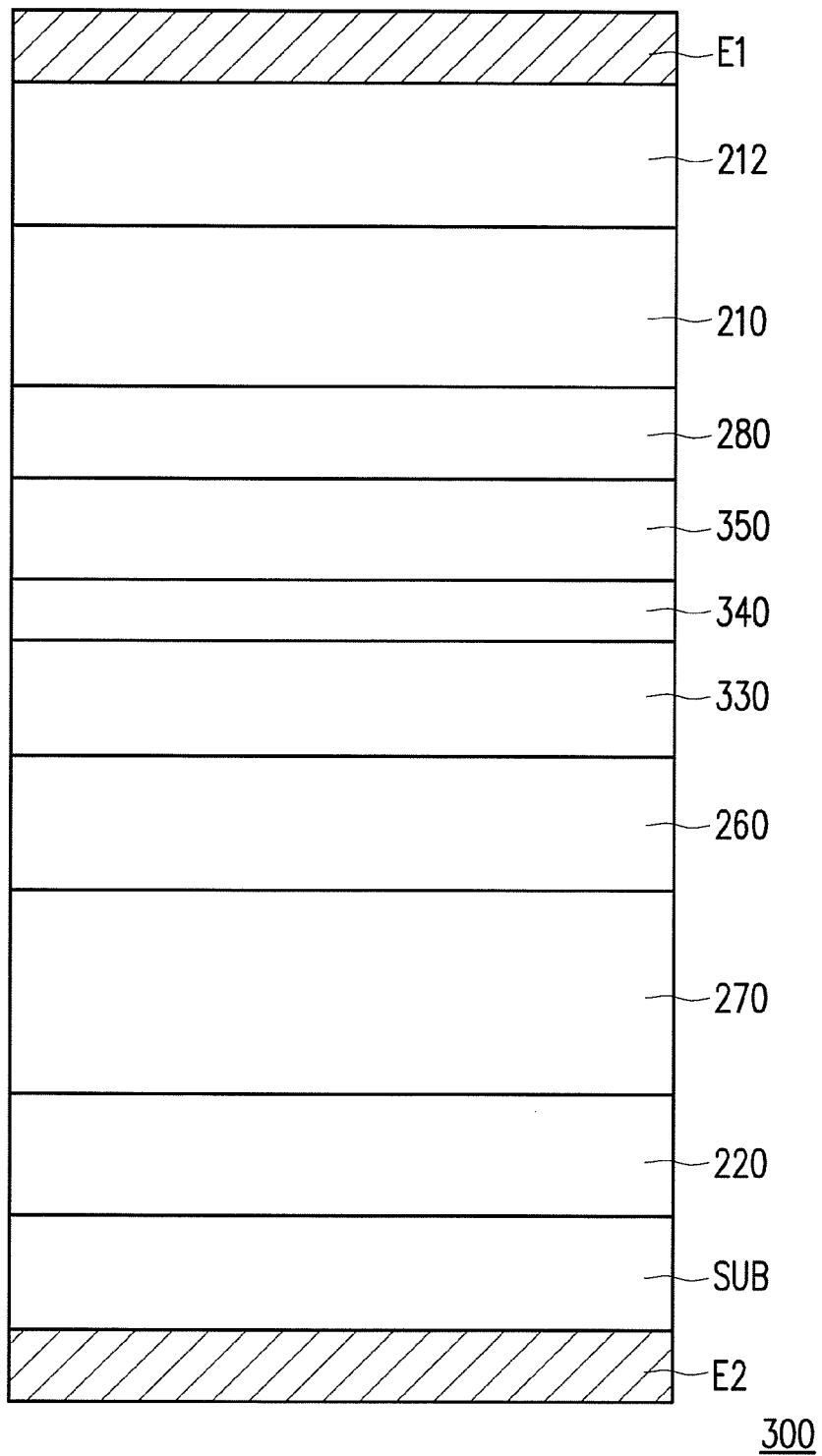
FIG. 3 is a schematic of a semiconductor light-emitting device of yet another embodiment of the invention.

FIG. 3 is a schematic of a semiconductor light-emitting device of yet another embodiment of the invention. Please refer to FIG. 3. It should be mentioned that, the invention is not limited to the relationship between the size and the thickness of each layered structure of the semiconductor light-emitting device illustrated in FIG. 3. In the present embodiment, a semiconductor light-emitting device 300 is similar to the semiconductor light-emitting device 200 of FIG. 2. Relevant components and functions of the semiconductor light-emitting device 300 are as described for the semiconductor light-emitting device 200 and are not repeated herein. The difference between the semiconductor light-emitting device 300 and the semiconductor light-emitting device 200 is that a hole injection layer 340 of the semiconductor light-emitting device 300 is disposed between a P-type waveguide layer 350 and a light-emitting layer 330. Specifically, the material and the structure of the hole injection layer 340 are similar to those of the hole injection layer 240 of the embodiment of FIG. 2, and the hole injection layer 340 also has a similar effect to the hole injection layer 240. Since the semiconductor light-emitting device 300 includes the hole injection layer 340, the electroluminescent efficacy of the semiconductor light-emitting device 300 can be increased.

Figure 4:
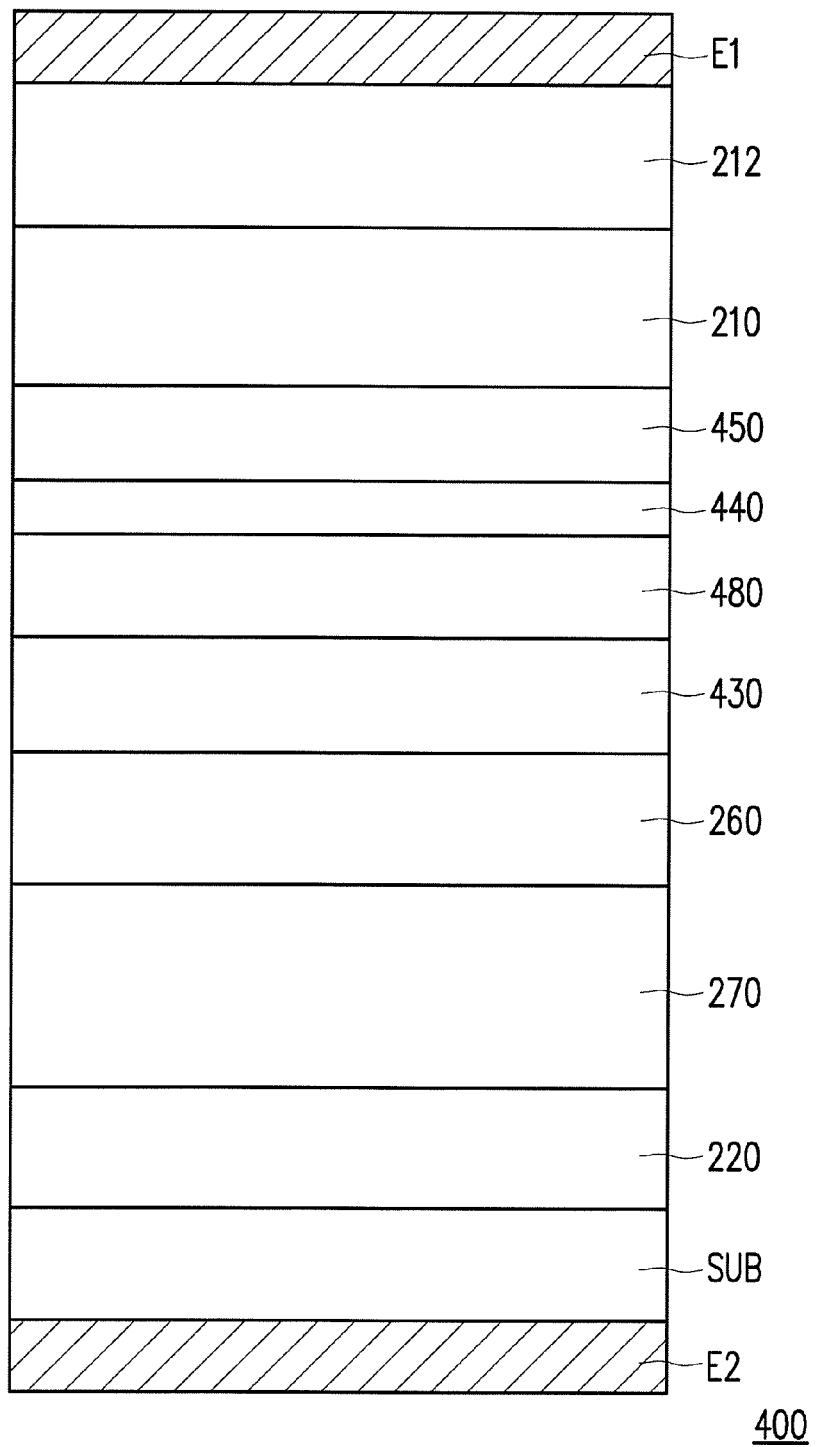
FIG. 4 is a schematic of a semiconductor light-emitting device of still yet another embodiment of the invention.

FIG. 4 is a schematic of a semiconductor light-emitting device of still yet another embodiment of the invention. Please refer to FIG. 4. It should be mentioned that, the invention is not limited to the relationship between the size and the thickness of each layered structure of the semiconductor light-emitting device illustrated in FIG. 4. In the present embodiment, a semiconductor light-emitting device 400 is similar to the semiconductor light-emitting device 200 of FIG. 2. Relevant components and functions of the semiconductor light-emitting device 400 are as described for the semiconductor light-emitting device 200 and are not repeated herein. The difference between the semiconductor light-emitting device 400 and the semiconductor light-emitting device 200 is that an EBL 480 of the semiconductor light-emitting device 400 is disposed between a P-type waveguide layer 450 and a light-emitting layer 430. Moreover, a hole injection layer 440 is disposed between the P-type waveguide layer 450 and the EBL 480. Specifically, the material and the structure of the hole injection layer 440 are similar to those of the hole injection layer 240 of the embodiment of FIG. 2, and the hole injection layer 440 also has a similar effect to the hole injection layer 240. Since the semiconductor light-emitting device 400 includes the hole injection layer 440, the electroluminescent efficacy of the semiconductor light-emitting device 400 can be increased.

Figure 5:
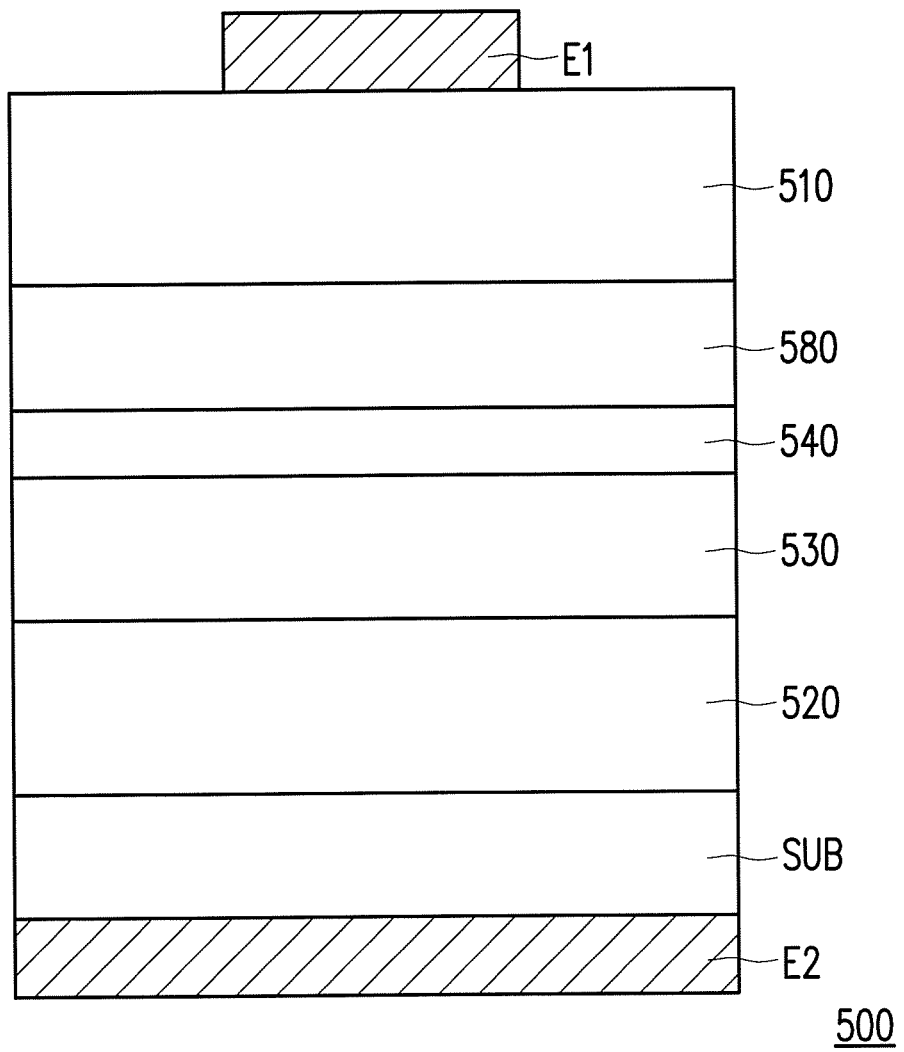
FIG. 5 is a schematic of a semiconductor light-emitting device of another embodiment of the invention.

FIG. 5 is a schematic of a semiconductor light-emitting device of another embodiment of the invention. Please refer to FIG. 5. It should be mentioned that, the invention is not limited to the relationship between the size and the thickness of each layered structure of the semiconductor light-emitting device illustrated in FIG. 5. In the present embodiment, a semiconductor light-emitting device 500 is similar to the semiconductor light-emitting device 100 of FIG. 1A. Relevant components and functions of the semiconductor light-emitting device 500 are as described for the semiconductor light-emitting device 100 and are not repeated herein. The difference between the semiconductor light-emitting device 500 and the semiconductor light-emitting device 100 is that the semiconductor light-emitting device 500 further includes an EBL 580 disposed between a P-type semiconductor cladding layer 510 and a light-emitting layer 530. Moreover, a hole injection layer 540 is disposed between the EBL 580 and the light-emitting layer 530. Specifically, the EBL 580 is similar to the EBL 280 of the embodiment of FIG. 2, and the EBL 580 is as described for the EBL 280. Moreover, the bandgap of the EBL 580 of the present embodiment is greater than the bandgap of the light-emitting layer 530. Therefore, the EBL 580 can block electrons passing through the light-emitting layer 530, such that the light-emitting efficacy of the semiconductor light-emitting device 500 can be increased.

In the present embodiment, the semiconductor light-emitting device 500 further includes a substrate SUB. The N-type semiconductor layer 520 is disposed between the light-emitting layer 530 and the substrate SUB. Specifically, the material of the substrate SUB of the semiconductor light-emitting device 500 is similar to the material of the substrate SUB of the semiconductor light-emitting device 200 of the embodiment of FIG. 2. The substrate SUB of the semiconductor light-emitting device 500 is as described for the substrate SUB of the semiconductor light-emitting device 200.

In the present embodiment, the first electrode E1 and the second electrode E2 of the semiconductor light-emitting device 500 are located at two opposite sides of the light-emitting layer 530. Specifically, the semiconductor light-emitting device 500 is, for instance, a vertical light-emitting diode (LED). In some embodiments, the semiconductor light-emitting device 500 can also be a horizontal LED or an LED of other structural types.

In the present embodiment, the hole injection layer 540 of the semiconductor light-emitting device 500 is similar to the hole injection layer 140 of the embodiment of FIG. 1A and FIG. 1B, and the hole injection layer 540 is as described for the hole injection layer 140. Specifically, since the semiconductor light-emitting device 500 includes the hole injection layer 540, and the hole injection layer 540 is disposed between the EBL 580 and the light-emitting layer 530, the hole injection layer 540 can provide more holes such that the light-emitting layer 530 achieves more electron-hole combining. At the same time, at least the material lattice defects or dislocations (not shown) of the P-type-doped semiconductor material layers (not shown) of the hole injection layer 540 are less, such that the lattice defects of the semiconductor light-emitting device 500 overall are less. Therefore, the electroluminescent efficacy of the semiconductor light-emitting device 500 is increased.

Figure 6:
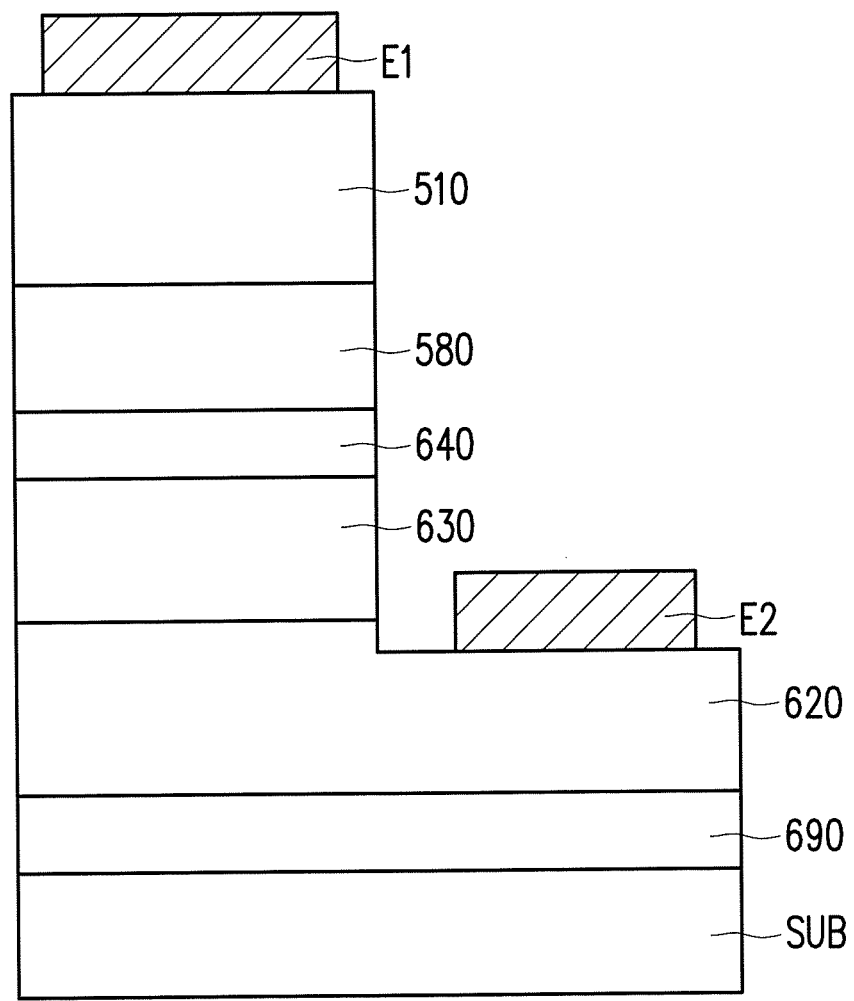
FIG. 6 is a schematic of a semiconductor light-emitting device of yet another embodiment of the invention.

FIG. 6 is a schematic of a semiconductor light-emitting device of yet another embodiment of the invention. Please refer to FIG. 6. It should be mentioned that, the invention is not limited to the relationship between the size and the thickness of each layered structure of the semiconductor light-emitting device illustrated in FIG. 6. In the present embodiment, a semiconductor light-emitting device 600 is similar to the semiconductor light-emitting device 500 of FIG. 5. Relevant components and functions of the semiconductor light-emitting device 600 are as described for the semiconductor light-emitting device 500 and are not repeated herein. The difference between the semiconductor light-emitting device 600 and the semiconductor light-emitting device 500 is that a second electrode E2 of the semiconductor light-emitting device 600 is disposed at the same side of an N-type semiconductor layer 620 opposite to a light-emitting layer 630. In other words, a first electrode E1 and the second electrode E2 of the semiconductor light-emitting device 600 are located at the same side opposite to the N-type semiconductor layer 620. Specifically, the semiconductor light-emitting device 600 is, for instance, a horizontal LED. The material of the substrate SUB of the semiconductor light-emitting device 600 is, for instance, a sapphire substrate. In some embodiments, the substrate SUB can be made of an electrically conductive or non-electrically conductive material. In the present embodiment, the semiconductor light-emitting device 600 further includes an unintentionally-doped semiconductor layer 690 disposed between the N-type semiconductor layer 620 and the substrate SUB. The material of the unintentionally-doped semiconductor layer 690 includes, for instance, unintentionally-doped GaN (u-GaN) or other semiconductor compounds. In some embodiments, the semiconductor light-emitting device 600 further includes a semiconductor buffer layer (not shown) disposed between the unintentionally-doped semiconductor layer 690 and the substrate SUB. Specifically, the semiconductor buffer layer is used to provide suitable stress release, such that the epitaxial quality of the semiconductor light-emitting device 600 can be improved.

In the present embodiment, the material and the structure of the hole injection layer 640 of the semiconductor light-emitting device 600 are similar to those of the hole injection layer 540 of the embodiment of FIG. 5, and the hole injection layer 640 also has a similar effect to the hole injection layer 540. Therefore, the electroluminescent efficacy of the semiconductor light-emitting device 600 can be increased.

Based on the above, the hole injection layer of the semiconductor light-emitting device of an embodiment of the invention is disposed between the P-type semiconductor cladding layer and the light-emitting layer. The hole injection layer includes a first SL structure formed by alternately stacking a plurality of magnesium nitride layers and a plurality of semiconductor material layers. The chemical formula of each of the semiconductor material layers is $Al_xIn_yGa_{1-x-y}N$, and $0 \leq x \leq 1$, $0 \leq y \leq 1$, and $0 \leq x+y \leq 1$. Since the semiconductor material layer achieves P-type doping via the diffusion of magnesium element of the magnesium nitride layer, the lattice defects of the semiconductor light-emitting device are less, and the efficacy of the semiconductor light-emitting device can be increased as a result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A semiconductor light-emitting device, comprising:
    a P-type semiconductor cladding layer, wherein the P-type semiconductor cladding layer is doped with magnesium;
    an N-type semiconductor layer;
    a light-emitting layer disposed between the P-type semiconductor cladding layer and the N-type semiconductor layer;
    a hole injection layer disposed between the P-type semiconductor cladding layer and the light-emitting layer, wherein the hole injection layer comprises a first super lattice structure formed by alternately stacking a plurality of magnesium nitride layers and a plurality of semiconductor material layers, a chemical formula of each of the semiconductor material layers is $Al_xIn_yGa_{1-x-y}N$, and $0 \leq x \leq 1$, $0 \leq y \leq 1$, and $0 \leq x+y \leq 1$; and an EBL disposed between the P-type semiconductor cladding layer and the light-emitting layer, wherein the hole injection layer is disposed between the EBL and the light-emitting layer, and a bandgap of the EBL is greater than a bandgap of the light-emitting layer.

2. The semiconductor light-emitting device of claim 1, wherein a thickness ratio of the magnesium nitride layer and the semiconductor material layer is within a range of 0.1 to 1.5.

3. The semiconductor light-emitting device of claim 1, wherein each of the semiconductor material layers is doped with a Group IV element having a concentration within a range of $10^{16}$ cm$^{-3}$ to $10^{20}$ cm$^{-3}$.

4. The semiconductor device of claim 3, wherein the Group IV element is carbon.

5. The semiconductor light-emitting device of claim 1, wherein a magnesium concentration of the magnesium nitride layers is greater than a magnesium concentration of the P-type semiconductor cladding layer.

6. The semiconductor light-emitting device of claim 1, further comprising:
   a P-type waveguide layer disposed between the P-type semiconductor cladding layer and the light-emitting layer;
   an N-type waveguide layer disposed between the N-type semiconductor layer and the light-emitting layer; and
   an N-type semiconductor cladding layer disposed between the N-type semiconductor layer and the N-type waveguide layer, wherein the hole injection layer is disposed between the P-type waveguide layer and the light-emitting layer, or disposed between the P-type waveguide layer and the P-type semiconductor cladding layer.

7. The semiconductor light-emitting device of claim 6, further comprising an electron blocking layer (EBL) disposed between the P-type semiconductor cladding layer and the P-type waveguide layer, wherein a bandgap of the EBL is greater than a bandgap of the light-emitting layer.

8. The semiconductor light-emitting device of claim 7, wherein the hole injection layer is disposed between the EBL and the P-type waveguide layer.

9. The semiconductor light-emitting device of claim 7, wherein the hole injection layer is disposed between the P-type waveguide layer and the light-emitting layer.

10. The semiconductor light-emitting device of claim 7, wherein a material of the EBL comprises aluminum gallium indium nitride (AlGaInN).

11. The semiconductor light-emitting device of claim 6, further comprising an EBL disposed between the P-type waveguide layer and the light-emitting layer, wherein the hole injection layer is disposed between the P-type waveguide layer and the EBL, and a bandgap of the EBL is greater than a bandgap of the light-emitting layer.

12. The semiconductor light-emitting device of claim 6, wherein a material of the P-type waveguide layer and a material of the N-type waveguide layer comprise indium gallium nitride (InGaN).

13. The semiconductor light-emitting device of claim 6, wherein the P-type semiconductor cladding layer or the N-type semiconductor cladding layer comprises a second super lattice structure formed by alternately stacking a plurality of AlGaInN layers and a plurality of gallium nitride layers.

14. The semiconductor light-emitting device of claim 1, wherein a material of the EBL comprises AlGaInN.

\* \* \* \* \*